(12) United States Patent
Harris et al.

(10) Patent No.: US 6,252,250 B1
(45) Date of Patent: Jun. 26, 2001

(54) HIGH POWER IMPATT DIODE

(75) Inventors: Christopher Harris, Sollentuna; Andrei Konstantinov, Järfälla, both of (SE)

(73) Assignee: Acreo AB, Kista (SE)

( * ) Notice: Subject to any disclaimer, the term of this patent is extended or adjusted under 35 U.S.C. 154(b) by 0 days.

(21) Appl. No.: 09/272,768

(22) Filed: Mar. 19, 1999

(51) Int. Cl.$^7$ .............................................. H01L 31/0312
(52) U.S. Cl. .............................................. 257/77; 257/604
(58) Field of Search .............................. 257/604, 77, 606

(56) References Cited

U.S. PATENT DOCUMENTS

| | | | |
|---|---|---|---|
| 3,663,874 | * 5/1972 | Fukukawa et al. | 317/235 T |
| 3,890,630 | 6/1975 | Huang . | |
| 4,060,820 | * 11/1977 | Pucel et al. | 357/13 |
| 4,201,604 | 5/1980 | Bierig et al. . | |
| 4,466,938 | * 8/1984 | Gigl et al. | 264/332 |
| 4,596,070 | 6/1986 | Bayraktaroglu . | |
| 5,512,776 | * 4/1996 | Bayraktaroglu | 257/604 |
| 5,776,837 | * 7/1998 | Palmour | 438/767 |

FOREIGN PATENT DOCUMENTS

| | | |
|---|---|---|
| 3915053 | 11/1990 | (DE) . |
| 1455811 | 11/1976 | (GB) . |
| 1514020 | 6/1978 | (GB) . |

OTHER PUBLICATIONS

Neudeck et al., Positive Temperature Coefficient of Breakdown Voltage in 4H–SiC PN Junction Rectifiers IEEE Electron Device Letters, V 18, pp. 96–98, Mar. 1997.*

Sankin, V.I., Litvin, D.P. and Vodakov, Yu.A, "Physical and Practical Aspects of Electron Heating in Superlatticeæ–SiC", Springer Proceedings in Physics vol. 56, Amorphous and Crystalline Silicon Carbide III (e.d. Harris, G.L., Spencer, M.G. and Yang, C.Y.), Springer–Verlag Berlin (1992) pp. 225–229.

Neudeck, P. And Fazi, C. "Positive Temperature Coefficient of Breakdown Voltage in 4H–SiC PN Junction Rectifiers", IEEE Electron Device Lett. 18, pp. 96–98 (Mar. 1997).

Palmour, J.W. and Lipkin, L., "High Temperature Power Devices in Silicon Carbide", Transactions of 2nd Int'l Conf. On High Temperature Electronics (Sandia Nat. Laboratories, 1994), pp. XI–3–XI–8.

Bauer, T. and Freyer, J. "New Mounting Technique for Two–Terminal Millimetre–Wave Devices", Electronics Lett. vol. 30, No. 1, pp. 868–869 (1994).

* cited by examiner

*Primary Examiner*—Olik Chaudhuri
*Assistant Examiner*—Douglas A. Wille
(74) *Attorney, Agent, or Firm*—Dilworth & Barrese

(57) ABSTRACT

In a high power IMPATT ( Impact Avalanche Transit Time) diode for generating high frequency signals two electrodes, anode (2) and cathode (1), are arranged with a semiconductor layer therebetween. Said semiconductor layer comprises a drift layer (7) for transport of charge carriers between the electrodes. The semiconductor layer is made of crystalline SiC and it is provided with means (9) adapted to locally increase the electric field in the drift layer substantially with respect to the average electric field therein for generating an avalanche breakdown at a considerably lower voltage across the electrodes than would the electric field be substantially constant across the entire drift layer.

25 Claims, 2 Drawing Sheets

HIGH POWER IMPATT DIODE

FIELD OF THE INVENTION AND PRIOR ART

The present invention relates to a high power IMPATT (Impact Avalanche Transit Time) diode for generating high frequency signals having two electrodes, an anode and a cathode, and a semiconductor layer therebetween with a junction for blocking conduction of the diode when a voltage is applied in a reverse direction across the electrodes, said semiconductor layer comprising a low doped n-type drift layer between the junction and a first of said electrodes through which charge carriers are transported upon avalanche breakdown in the semiconductor layer and avalanche multiplication of charge carriers when a voltage high enough is applied across the electrodes in said reverse direction.

Such a diode employs the avalanche and carrier drift processes occurring in a semiconductor to produce a dynamic negative resistance at microwave frequencies. This diode is one of the most powerful sources of microwave power. It may be used to produce high power signals for frequencies above 30 GHz.

This type of diode has been described in the literature by for instance READ, and the general function thereof is that a direct voltage is applied across the diode in the reverse direction thereof, and an alternating voltage source is generated within an external resonance circuit for which the IMPATT diode provides the active power input, said alternating voltage having a lower amplitude than the magnitude of the direct voltage so as to change the reverse voltage across the diode with time, This is done so that the electric field will during at least a part of the positive half period of the alternating voltage with respect to the direct voltage be above the breakdown field for the semiconductor in question, so that avalanche breakdown will occur and an exponential growth of the electron-hole concentration in the avalanche region of the semiconductor layer will result as a consequence of the production of secondary electron-hole pairs by impact ionization. The electrons so formed move through the drift layer to the anode with a drift velocity corresponding to the saturation drift velocity. The transit time of said electrons from the avalanche region to the anode is preferably half the period of the alternating voltage, so that the electrons will reach the anode when the alternating voltage is zero thereby minimising losses.

It is desired to produce such diodes being able to deliver a high power output at high operation frequencies. The power output decreases with operation frequency f as 1/f or $1/f^2$. An ideal semiconductor material for a diode of this type should have a high breakdown field, a high saturation drift velocity and a high thermal conductivity. With a high breakdown field the diodes with a given transit time can have much higher operation voltages and by that deliver higher powers. A high saturation drift velocity further decreases the transit time for the same drift region thickness and by that increases the possible frequency. A high thermal conductivity is required to overcome thermal limitations. Such thermal limitations are highly relevant for this type of devices, since the power dissipation is very high, namely more than 50% of the electric power supplied to an IMPATT diode is dissipated within the device as compared to lower frequency power semiconductor switches for which mostly less than 1% of the electric power supplied is dissipated.

A possible material for a high power IMPATT diode with an output power significantly increased with respect to such a diode of silicon would be silicon carbide, since it has a high breakdown field, a high saturation drift velocity as well as a high thermal conductivity and is stable at high temperatures. However, for different reasons it has until now not been possible to produce any working IMPATT diode of silicon carbide. The main problem seems to be to take care of the high power dissipated by such a diode. The high breakdown field of silicon carbide will namely result in such a high breakdown voltage and accordingly operation voltage of the diode that such a diode could not withstand care of the heat dissipated, since the current density has to have a certain value for obtaining avalanche resonance. This means that thermal limitations have until now prevented the use of this promising material (silicon carbide) for IMPATT diodes.

SUMMARY OF THE INVENTION

The object of the present invention is to provide a high power IMPATT diode of the type defined in the introduction being able to deliver a much higher output power than such diodes already known and working.

This object is according to the invention obtained by making the semiconductor layer of such a diode of crystalline SiC and providing the semiconductor layer with means adapted to locally increase the electric field in the drift layer substantially with respect to the average electric field therein for generating said avalanche breakdown at a considerably lower voltage across said electrodes than it would be if the doping of the active region of the diode were substantially constant across the entire active-region layer. Accordingly, said means will "trigger" the diode at an earlier stage, so that the operation voltage thereof will be considerably decreased for a given drift region length. This means that a higher current density may be achieved with the same power dissipation, or the power dissipation will be considerably reduced for a given current density. Accordingly, the thermal limitation of such diodes of SiC has been overcome by sacrificing a significant part of the theoretically available power density and partly the efficiency. Furthermore, the current density may be given such a value, that so-called near-resonance conditions could be achieved in the avalanche region and by that more optimized conditions of generation under continious-wave operation will be ensured.

According to preferred embodiments of the invention said means is adapted to cause an avalanche breakdown at a voltage across said electrodes being a factor of less than 50% and as an alternative 30% of the breakdown voltage of the diode had the active region doping been substantially constant across the entire active region thickness.

According to another preferred embodiment of the invention said means comprises a thin n-type layer with a substantially higher doping concentration than the drift layer arranged in the drift layer at a distance from said junction for locally increasing the electric field in a region of the drift, layer between said thin layer and the junction with respect to the average electric field in the drift layer. Such a thin layer with a higher doping concentration will result in a high, nearly constant electric field and accordingly a well defined avalanche region between said junction and said thin layer. The breakdown voltage of the diode may in this way be lowered substantially.

According to another preferred embodiment of the invention the distance between said junction and said thin layer is short with respect to the thickness of the drift layer, preferably less than $\frac{1}{5}$, and most preferred less than $\frac{1}{10}$ thereof. It has been found that the current required to achieve the avalanche resonance at a given frequency is rapidly decreased with a decreasing distance between the junction and the thin layer, which makes it easier to arrive to a negative differential resistance operation mode, i.e. operation with a frequency close to the avalanche resonance frequency.

According to another preferred embodiment of the invention the doping concentration of said thin layer is at least an order of magnitude, preferably at least two orders of magnitude higher than the doping concentration of the drift layer. Such a high doping concentration will considerably reduce the breakdown voltage of the diode.

According to another very preferred embodiment of the invention said semiconductor layer is made of crystalline SiC of the 4H polytype.

Another problem encountered in the attempts to produce this type of device in SiC and not addressed sofar, is that a particular problem with the temperature dependency of the breakdown voltage adheres to SiC, but is absent for most other semiconductor materials. The SiC pofytypes suggested sofar for this type of diodes, such as 6H, have an avalanche breakdown voltage decreasing with the temperature, which results in a risk of thermal runaway and current filamentation. This means that the avalanche breakdown will tend to form a self-sustained high current filament, and the elevated local temperature in the filament region results in a locally lower breakdown voltage, which, in turn, promotes further filamentation. However, this problem is solved by making said semiconductor layer of crystalline SiC of the 4H polytype. It has been found that this polytype has a breakdown voltage increasing with the temperature, so that hotter spots will have a higher breakdown voltage resulting in a mechanism for current limitation. Thus, no filamentation will occur for 4H SiC.

According to another preferred embodiment of the invention said semiconductor layer is orientated with the vertical direction thereof substantially parallel to the principle axis of the crystal. It has been found that this orientation of 4H SiC will result in an advantageous behaviour with respect to the temperature dependence of the breakdown voltage.

According to another preferred embodiment of the invention said thin layer is laterally separated from the periphery of the diode, and the lateral separation of said thin layer from the periphery of the diode is most preferably larger than the distance between said thin layer and said junction, i.e. the avalanche multiplication region. This prevents undesirable surface effects and current filamentation that could result from such effects, since the high field region will not intersect the crystal surface. The risk of early peripheral breakdown will also be considerably reduced.

According to another preferred embodiment of the invention said junction is a Schottky barrier junction formed by a metal layer applied next to the drift layer at a second of said electrodes, and according to a further development of this embodiment the drift layer is connected directly to a metal layer forming said first electrode. An elimination of the effect of neutral regions on the device performance is obtained by elimination of the ohmic contacts. The elimination of ohmic anode contact will increase the overall voltage drop at the device by the value of the contact potential. On the other hand, using the barrier anode contact instead of a combination of a highly doped n-type contact region and an ohmic contact will entirely eliminate the alternating current (AC) losses in the contact region and eventually improve the device efficiency.

According to another preferred embodiment of the invention a diode is composed of an array of small sub-diodes with the characteristics defined mounted in parallel and laterally spaced onto a common heat sink. This will make it possible to obtain an efficiency of the dissipation of heat generated in an IMPATT diode of SiC being high enough. The individual sub-diodes have preferably a small diameter comparable to the thickness of the drift layer, so that the heat generated may be efficiently dissipated. It is preferred to make said heat sink of a material with a high thermal conductivity, such as diamond or electroplated gold.

Further advantages as well as preferred features of the invention will appear from the following description and the other dependent claims.

BRIEF DESCRIPTION OF THE DRAWINGS

With reference to appended drawings, below follows a specific description of preferred embodiments of the invention cited as examples.

In the drawings.

DETAILED DESCRIPTION OF PREFERRED EMBODIMENTS OF THE INVENTION

Figure 1A:
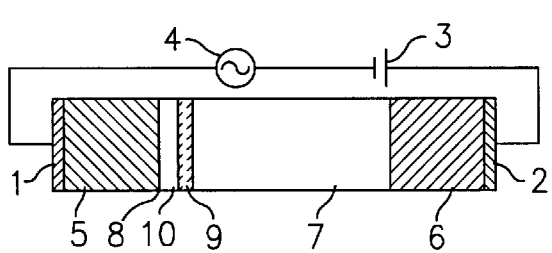
FIG. 1a is a very schematic cross-section view of an IMPATT diode according to a first preferred embodiment of the invention.

FIG. 1 illustrates a high power IMPATT (Impact Ionisation Avalanche Transit Time) diode for generation of power signals with a frequency above 30 GHz. This diode has two electrodes, namely a cathode 1 and an anode 2, adapted to be connected to a direct voltage source 3 and positioned in a microwave cavity 4 designed so as to have the resonance at desired microwave frequency. A semiconductor layer of crystalline SiC is arranged between the two electrodes and has a highly doped p-type layer 5 in contact with the metal cathode 1, a highly doped n-type layer 6 in contact with the metal anode 2, and a low doped n-type drift layer 7 interconnecting the layers 5 and 6. The layers 5 and 7 forms a pn-junction 8, which is reverse biased by the direct voltage of the direct voltage source 3. Furthermore, a thin n-type layer 9 with a substantially higher doping concentration than the drift layer is arranged in the drift layer 7 at a short distance from the highly doped p-type layer 5. The thin layer 9 has preferably a doping concentration being at least an order of magnitude, preferably at least two orders of magnitude higher than the doping concentration of the drift layer 7. This thin layer has preferably a thickness of 0.05 µm –0.1 µm. An active region layer of the diode is formed by the layers 7, 9 and 10 (10 is actually a part of 7).

Figure 1B:
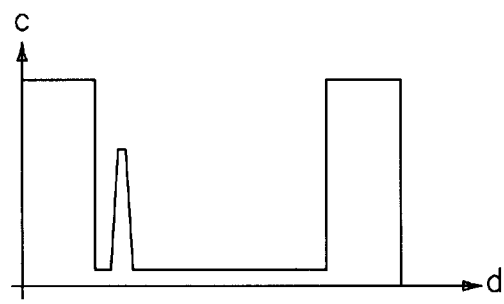
FIG. 1b illustrates the doping profile of the diode according to FIG. 1a, FIG. 1c is a diagram of the electric field versus depth of the diode according to FIG. 1a, FIG. 2 is a very schematic cross-section view of the diode according to FIG. 1a from a direction being substantially perpendicular to that according to FIG. 1a, FIG. 3 is a view similar to that of FIG. 1a of an IMPATT diode according a second preferred embodiment of the invention, FIG. 4a and b illustrate the voltage across the electrodes of the diode according to FIG. 1a versus time as well as the avalanche current and terminal current of the diode according to FIG. 1a versus time.
Figure 1C:
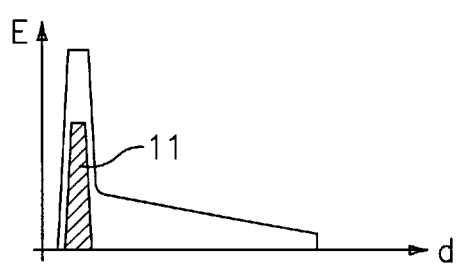

The concentration of the donor and acceptor dopants in the different layers of the diode according to FIG. 1a is illustrated in FIG. 1b as C versus the depth d. This doping profile will result in a nearly constant electric field in the region 10 between the thin layer 9 and the p-type layer 5 as illustrated in FIG. 1c, and the electric field will thanks to the higher doping of the thin layer 9 fall substantially through the thin layer 9, so that the electric field will be much higher in the region 10 than in the rest of the drift layer. This means that the avalanche breakdown and the creation of free charge carriers as a result of avalanche multiplication will substantially only take place in this so-called avalanche region 10, since the ionization coefficient is a sharp function of electric field, proportional to $E^n$, in which the exponent n is typically 4–6. It is shown in FIG. 1c how charge carriers 11 are formed in this way through avalanche multiplication.

Figure 2:
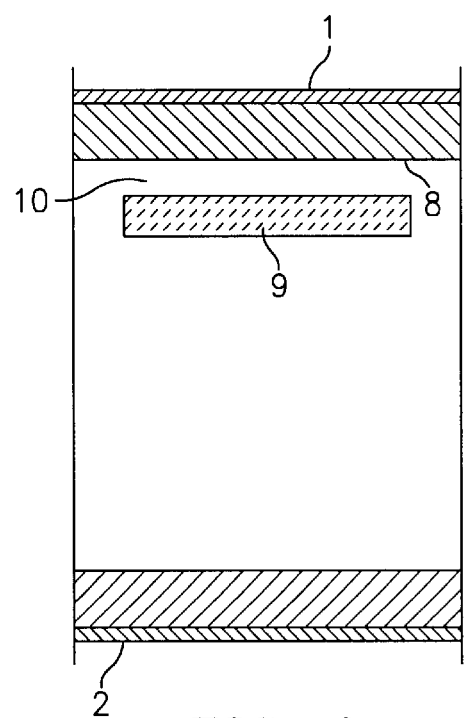

FIG. 2 illustrates how the thin layer 9 is laterally separated from the periphery of the diode by a distance being larger than the distance between said thin layer 9 and the pn-junction 8, i.e. the avalanche multiplication region 10. Early breakdown at the device periphery is by this avoided.

Figure 3:
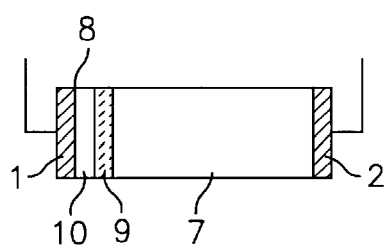

The embodiment according to FIG. 3 differs from that according to FIG. 1a by the fact that the p-type layer has been omitted, so that there is only a cathode metal layer 1 forming a Schottky barrier junction 8 to the drift layer, and the layer 6 has also been removed and a metal layer forming the anode 2 is applied directly on the drift layer 7. Elimination of the ohmic anode contact in this way will increase the overall voltage drop at the device by the value of the contact potential. On the other hand, using the barrier anode contact instead of a combination of a highly doped n-type contact region and an ohmic contact will entirely eliminate the AC losses in the contact region and eventually improve the device efficiency.

Figure 4A:
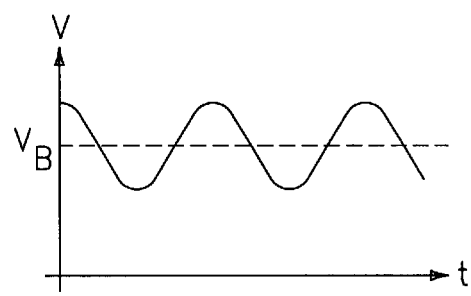
Figure 4B:
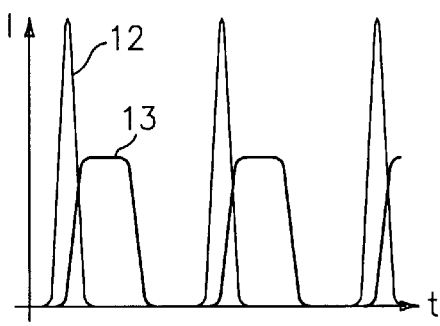

The general function of an IMPATT diode according to FIG. 1a and FIG. 3 is illustrated in FIG. 4, which illustrates the voltage V between the electrodes 1, 2 versus time t, in which $V_B$ is the breakdown voltage of the diode. This breakdown voltage is substantially lower than would the thin layer 9 not be there, since the high electric field obtained in the avalanche multiplication region 10 through this thin layer will result in a triggering of the diode, i.e. an avalanche breakdown, at a substantially lower voltage across the device than would the thin layer not be there. This results in the advantages mentioned above of a possibility to have a higher current density with the same power dissipation. Furthermore, the avalanche multiplication will take place in the very restricted region 10 for resulting in a sharp peak 12 of the avalanche current. In operation of the diode, there will be a phase shift of 180° between the applied AC voltage and the current 13 at the device terminals as illustrated in FIG. 4. This is obtained via a combination of delays due to avalanche development and carrier transit time. The use of avalanche injection is critical for device operation in order to obtain a 90° delay between the peaks of applied voltage and carrier injection. After injection the carriers must travel through the drift layer 7 for about half a period of the AC voltage. In order to have a transit time being independently of the alternating voltage the saturated drift velocity shall be reached at an electric field much lower than the breakdown field. This is possible for SiC. The transit time will be a function of said drift velocity and the thickness of the drift layer 7, and the frequency will it its turn be ½T, in which T is said transit time. SiC allows a thinner drift layer 7 for a certain breakdown voltage than Si, and the saturation drift velocity is also higher in SiC than Si, so that higher frequencies may be obtained, or higher powers may be generated at a given frequency It is important that the current is not smeared out and that there is a perfect 180° phase shift between the current and the alternating voltage at the terminals, since there will otherwise be an overlap between the current and the voltage and efficiency problems will arise.

Figure 5:
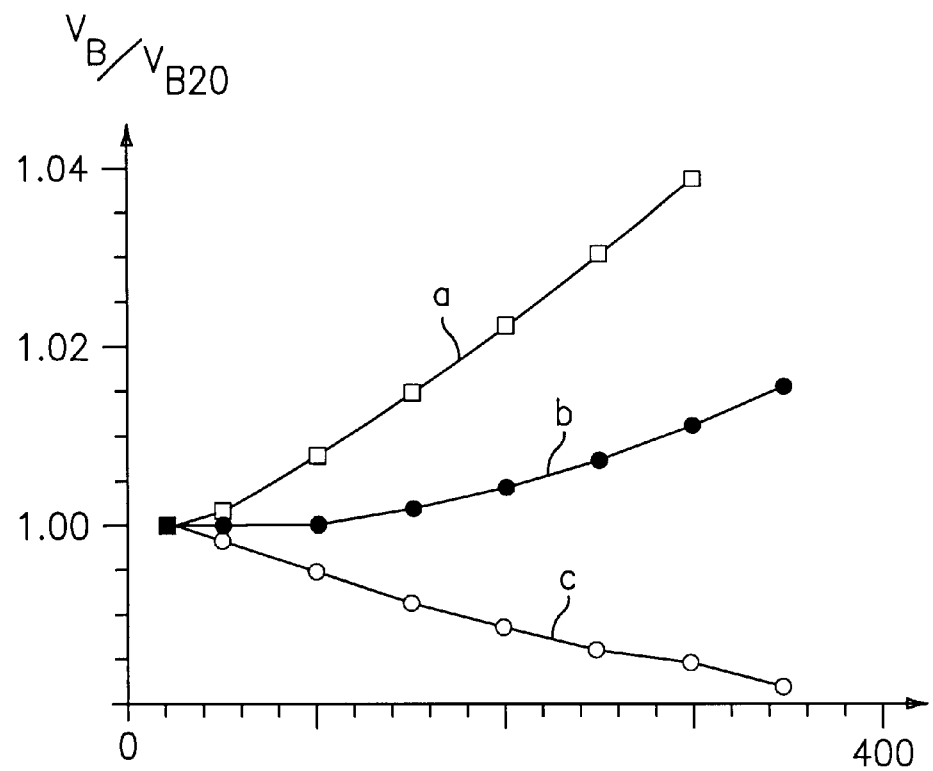
FIG. 5 is a diagram illustrating the breakdown voltage of a diode according to FIG. 1a versus temperature for different polytypes of SiC.

According to a very preferred embodiment of the invention SiC of the 4H polytype is used as semiconductor layer in the diode, and the diode is preferably orientated with the principle axis substantially perpendicular to the vertical direction (current direction) of the device. This is very advantageous, since this silicon carbide polytype exhibit an avalanche breakdown voltage increasing with the temperature, so that thermal runaway and current filamentation will be prevented. This problem with the sign of the temperature dependence does not exist dealing with IMPATT diodes in other known semiconductor materials, such as silicon or III–V group compounds, because the avalanche breakdown for silicon and these compounds always increases with increasing crystal temperature. It is illustrated in FIG. 5 how the relation of breakdown voltage $V_B$ and the breakdown voltage at 20° C. is changed with the temperature for a) the polytype 4H with a breakdown voltage of 452 V at 20° C., b) 4H at 107 V and c) 6H at 460 V. It appears that the avalanche breakdown voltage of the pn-junction for 4H SiC increases with the temperature in the range of at least from 20° C. to 300° C., which is the temperature range required for IMPATT applications.

Figure 6:
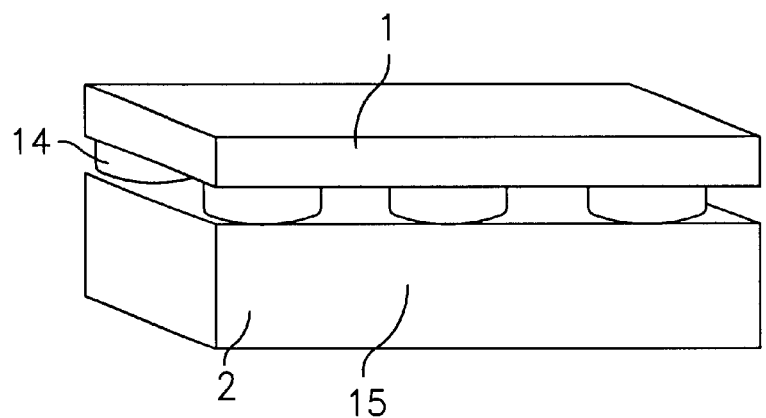
FIG. 6 is a schematic perspective view of an IMPATT diode according to a preferred embodiment of the invention.

As already mentioned, the maximum power of an IMPATT diode in continuous-wave operation is typically governed by thermal, rather than by electronic limitations. As already stated, it is an important feature of the present invention to reduce the breakdown voltage of the diode by locally increasing the electric field for addressing the problem of high power dissipation. An important advantage of SiC is for sure given by the high value of thermal conductivity and high maximum operation temperature of SiC, but successful results can only be achieved if these advantages are used to the full extent. In fact, thermal limitations restrict the maximum power density to a value around 1 MW/cm$^2$. The maximum power density that can be dissipated in a thin circular device decreases with the device diameter. Accordingly, it is preferable to fabricate a device as an array of small devices, i.e. an IMPATT diode as an array of small subdiodes 14 as illustrated in FIG. 6, rather than to form a large single device if power density is an issue. For silicon carbide a large number of small mesa diodes must be mounted on a heat sink 15 even if the heat sink is of diamond having a very high thermal conductivity. The heat sink may also be of electroplated gold. The diameters of the individual sub-diodes is comparable to the thickness of the drift layer of these sub-diodes.

The invention is of course not in any way restricted to the preferred embodiment thereof discussed above, but many possibilities to modifications thereof would be apparent to a man with ordinary skill in the art without departing from the basic idea of the invention as defined in the appended claims.

Any means resulting in a local increase of the electric field in the drift layer may be used for lowering the voltage at which the diode is trigged.

What is claim is:

1. A high power IMPATT (Impact Avalanche Transit Time) diode for generating high frequency signals having two electrodes, an anode (2) and a cathode (1), and a semi-conductor layer there between, with a pn-junction (8) for blocking conduction of the diode when a voltage is applied in a reverse direction across the electrodes, said semiconductor layer comprising a low doped n-type drift layer (7) between the junction (8) and a first (2) of said electrodes through which charge carriers are transported upon avalanche breakdown in the semiconductor layer and avalanche multiplication of charge carriers when a voltage high enough is applied across the electrodes in said reverse direction, characterized in that said semiconductor layer is provided with means (9) structured and arranged to locally increase the electrical field in the drift layer substantially with respect to the average electric field therein for generating said avalanche breakdown at a considerably lower voltage across said electrodes than if the doping of the active region of the diode were substantially constant across the entire active-region layer (7,9), said semiconductor is made of crystalline 4H SiC oriented such that the avalanche process occurs parallel to a principal axis (c-axis), said semiconductor layer contains a localized avalanche region structured and arranged such that the electric field therein is substantially higher than the average field in the region adjacent to the avalanche region, and said semiconductor layer is oriented with a current direction thereof substantially parallel to the principal axis of the crystal and to a plane of the substrate.

2. A diode according to claim 1, characterized in that said means (9) is adapted to cause an avalanche breakdown at a voltage across said electrodes (1, 2) being a factor of less than 50% of the breakdown voltage of the diode would the active-layer doping be substantially constant across the entire active region thickness.

3. A diode according to claim 2, characterized in that said factor is less than 30%.

4. A diode according to claim 1, characterized in that said means comprises a thin n-type layer (9) with a substantially higher doping concentration than the drift layer (7) arranged in the drift layer at a distance from said junction (8) for locally increasing the electric field in a region (10) of the drift layer between said thin layer and the junction with respect to the average electric field in the drift layer.

5. A diode according to claim 4, characterized in that the distance between said junction (8) and said thin layer (9) is short with respect to the thickness of the drift layer, preferably less than 1/5, and most preferred less than 1/10 thereof.

6. A diode according to claim 5, characterized in that distance between said junction (8) and said thin layer (9) is less than 0.2 µm, preferably between 0.1 µm and 0.05 µm.

7. A diode according to claim 3, characterized in that the doping concentration of said thin layer (9) is at least an order of magnitude, preferably at least two orders of magnitude higher than the doping concentration of the drift layer (7).

8. A diode according to any of claim 1, characterized in that the semiconductor layer is designed to have a breakdown voltage increasing with the temperature thereof.

9. A diode according to any of claim 4, characterized in that said thin layer (9) is laterally separated from the periphery of the diode.

10. A diode according to claim 9, characterized in that the lateral separation of said thin layer (9) from the periphery of the diode is larger than the distance between said thin layer (9) and said junction (8), i.e. the avalanche multiplication region (10).

11. A diode according to claim 1, characterized in that said semiconductor layer of SiC comprises a highly doped p-type sub-layer (5) forming a pn-junction (8) with the rift layer (7).

12. A high power IMPATT (Impact Avalanche Transit Time) diode for generating high frequency signals having two electrodes, an anode (2) and a cathode (1), and semiconductor layer therebetween, with a junction (8) for blocking conduction of the diode when a voltage is applied in a reverse direction across the electrodes, said semi-conductor layer comprising a low n-type drift layer (7) between the junction (8) and a first (2) of said electrodes through which charge carriers are transported upon avalanche breakdown in the semiconductor layer and avalanche multiplication of charge carriers when a voltage high enough is applied across the electrodes in said reverse direction, characterized in that said semi-conductor layer is provided with means (9) structured and arranged to locally increase the electrical field of the drift layer substantially with respect to the average electric field therein for generating said avalanche breakdown at a considerably lower voltage across the electrodes than if the doping of the active region of diode were substantially constant across the entire active-region layer (7,9), said semi-conductor is made of crystalline 4H SiC oriented such that the avalanche process occurs parallel to a principal axis (c-axis).

said semi-conductor layer contains a localized avalanche region structured and arranged such that the electric field therein is substantially higher than the average field in the region adjacent to the avalanche region, said semi-conductor layer is oriented with a current direction thereof substantially parallel to the principal axis of the crystal and to a plane of the substrate, and said junction (8) is Schottky barrier junction formed by a metal layer (1) applied next to the drift layer (7) at a second of said electrodes.

13. A diode according to claim 12, characterized in that the drift layer (7) is connected directly to a metal layer forming said first electrode (2).

14. A diode according to claim 1, characterized in that the thickness of said drift layer (7) is selected with respect to the charge carrier mobility therein and the voltage there across at occurrence of said avalanche breakdown for obtaining the frequency desired of said signals, corresponding to a transit time of the charge carriers through the drift layer of ½f, f being the frequency of an AC voltage applied across the electrodes on top of a reverse biasing direct voltage.

15. A diode according to claim 1, characterized in that it is adapted to generate signals having a frequency above 10 GHz, especially above 20 GHz, more particularly above 30 GHz and preferably above 35 GHz.

16. A diode according to claims 1, characterized in that it is composed of an array of small sub-diodes (14) with the characteristics defined mounted in parallel and laterally spaced onto a common heat sink (15).

17. A diode according to claim 16, characterized in that said heat sink (15) is made of a material with a high thermal conductivity.

18. A diode according to claim 17, characterized in that the material of said heat sink (15) is diamond or electroplated gold.

19. A diode according to claim 1, characterized in that said diode comprises the arrangement in the following order of said cathode (1), a highly-doped p-type layer (5) in contact with said cathode (1), said low-doped n-type layer (7), said means (9) being constituted by a thin n-type layer having a substantially higher doping concentration than said drift layer (7) and being arranged along an edge of the drift layer (7) at a distance from said junction (8) between said drift layer (7) and highly doped p-type layer (5) and divides the drift layer (7) into portions (10, 7) such that an avalanche layer (10) of said drift layer (7) in which the electric field is much higher than the rest of the drift layer (7) is situated between said means (9) and junction (8) and abut said p-type layer (5), a highly-doped n-type layer (6) situated in contact with said drift layer (7) on an end thereof opposite said junction (8), and said anode (2) in contact with said highly-doped n-type layer (6).

20. A diode according to claim 1 structured and arranged such that avalanche breakdown and creation of free charge carriers as a result of avalanche multiplication substantially only takes place in an avalanche region (10) abutting said junction (8), because ionization coefficient is a sharp function of electric field proportional to $E^n$ in which the exponent n is generally 4–6.

21. A diode in accordance with claim 4, structured and arranged such that breakdown voltage is substantially lower than if said thin layer (9) is omitted, since a high electric field obtained in an avalanche multiplication region (10) situated between said junction (8) and thin layer (9) through said thin layer (9) results in a triggering of said diode (an avalanche breakdown) at a substantially lower voltage across said diode than if said thin layer (9) is omitted.

22. A diode according to claim 1, characterized in that avalanche breakdown voltage of the pn-junction (8) increases with temperature in the range of at least from 20° C. to 300° C.

23. A diode according to claim 1, characterized in that the 4H SiC possess a positive temperature coefficient of the avalanche breakdown.

24. A diode according to claim 1, additionally comprising a highly doped p-type layer (5) in contact with the cathode (1), a highly-doped n-type layer (6) in contact with the anode (2), said drift layer (7) interconnecting the highly doped p- and n-type layers (5,6) and forming, with said highly doped p-type layer (5), said pn-junction (8) reverse biased by direct voltage of a direct voltage source (3) coupled to the anode (2) and cathode (1).

25. A diode according to claim 22, characterized in that the avalanche breakdown voltage of the pn-junction (8) increases with temperature in the range of 100–300° C.

* * * * *